(12) United States Patent
Lin

(10) Patent No.: US 6,762,697 B2
(45) Date of Patent: Jul. 13, 2004

(54) KEYBOARD WITH FUNCTION KEYS

(75) Inventor: Yong-Sheng Lin, Xin-Zhuang (TW)

(73) Assignee: KYE Systems Corp. (TW)

( * ) Notice: Subject to any disclaimer, the term of this patent is extended or adjusted under 35 U.S.C. 154(b) by 360 days.

(21) Appl. No.: 09/974,953

(22) Filed: Oct. 10, 2001

(65) Prior Publication Data
US 2003/0067400 A1 Apr. 10, 2003

(51) Int. Cl.[7] .................................................. B41J 5/08
(52) U.S. Cl. ........................ 341/26; 400/473; 235/146
(58) Field of Search ............................. 235/145 R, 146; 341/20, 22, 23, 26; 400/472, 473, 476, 477, 479, 485, 489, 490; 345/168, 172; 708/145; 340/14.1, 14.2, 2.21

(56) References Cited

U.S. PATENT DOCUMENTS 5,897,257 A * 4/1999 Chen ........................... 400/473
5,986,586 A * 11/1999 Tsai ............................. 341/22

* cited by examiner

Primary Examiner—Albert K. Wong
(74) Attorney, Agent, or Firm—Raymond Sun

(57) ABSTRACT

A keyboard has a processor, a scan matrix coupled to the processor, a first set of keys coupled to the scan matrix, a logic control circuit, and a second set of keys coupled to the logic control circuit. The processor decodes the identity of a pressed key from the second set of keys via the logic control circuit.

9 Claims, 3 Drawing Sheets

| Switch on line | SW 1 | SW 2 | SW 3 | SW 4 | SW 5 | SW 6 | SW 7 | SW 8 |
|---|---|---|---|---|---|---|---|---|
| S0, S1, S2 | 000 | 001 | 010 | 011 | 100 | 101 | 110 | 111 |
| Y | 1 | 1 | 1 | 1 | 1 | 1 | 1 | 1 |

Fig. 3

KEYBOARD WITH FUNCTION KEYS

BACKGROUND OF THE INVENTION

1. Field of the Invention

The present invention relates to a keyboard, and in particular, to a keyboard having additional function keys.

2. Description of the Prior Art

Computers are now a mainstay in every person's life. The incorporation of multimedia functions with a conventional computer have significantly increased the power, popularity and usage of computers. Multimedia peripheral equipment, including but not limited to CD-ROMs and DVD players, are now often used with computers to provide multimedia effects on the monitor, speakers and other peripherals associated with the computer.

Despite the increased multimedia usage, computer systems and their associated peripherals are still controlled by conventional and well-known input devices such as keyboards and computer mice. To operate a multimedia device (e.g., "PLAY", "Fast Forward", "STOP", etc.), a user would still need to press the appropriate buttons and switches on the multimedia device.

In addition, a user often needs to input a series of instructions or key presses to execute certain applications. For example, to sign on to the Internet, a user may need to press a sequence of keys, or execute a sequence of mouse clicks.

To improve the user's convenience, efforts have been made to provide hot keys or additional function keys to a conventional QWERTY keyboard so that the user can control and manipulate multimedia devices via a single key on the keyboard, or execute certain applications through a single key on the keyboard. Unfortunately, a conventional QWERTY keyboard is normally provided with 108 key codes. After deducting the keys for designated language and system commands from the 108 key codes, there only remains eight keys that can be further defined. As a result, the conventional QWERTY keyboard is limited in its ability to provide additional function keys.

To address this drawback, U.S. Pat. No. 5,986,586 to Tsai provides an additional I/O port to form a new scan matrix for the keyboard. This is illustrated in FIG. 1, where a microprocessor A1 is connected to a new I/O port A2 to form a new 9×16 scan matrix, which is different from a conventional 8×16 scan matrix. The additional I/O port A2 adds an additional 16 keys A3 to the conventional scan matrix. Unfortunately, the additional I/O port A2 in U.S. Pat. No. 5,986,586 to Tsai poses certain problems. For example, this can only be implemented when the microprocessor A1 has an extra I/O port to connect the additional scan line, so its applicability can be limited to certain microprocessors. As another example, increasing the size of the conventional scan matrix may lead to the possibility of error in executing a defined function or procedure.

SUMMARY OF THE DISCLOSURE

It is an object of the present invention to provide a keyboard that allows the user to define a number of function keys.

It is another object of the present invention to provide a keyboard that increases the number of function keys.

In order to accomplish the objects of the present invention, the present invention provides a keyboard having a processor, a scan matrix coupled to the processor, a first set of keys coupled to the scan matrix, a logic control circuit, and a second set of keys coupled to the logic control circuit. The processor decodes the identity of a pressed key from the second set of keys via the logic control circuit.

BRIEF DESCRIPTION OF THE DRAWINGS

FIG. 3 illustrates the logic status utilized by the present invention.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
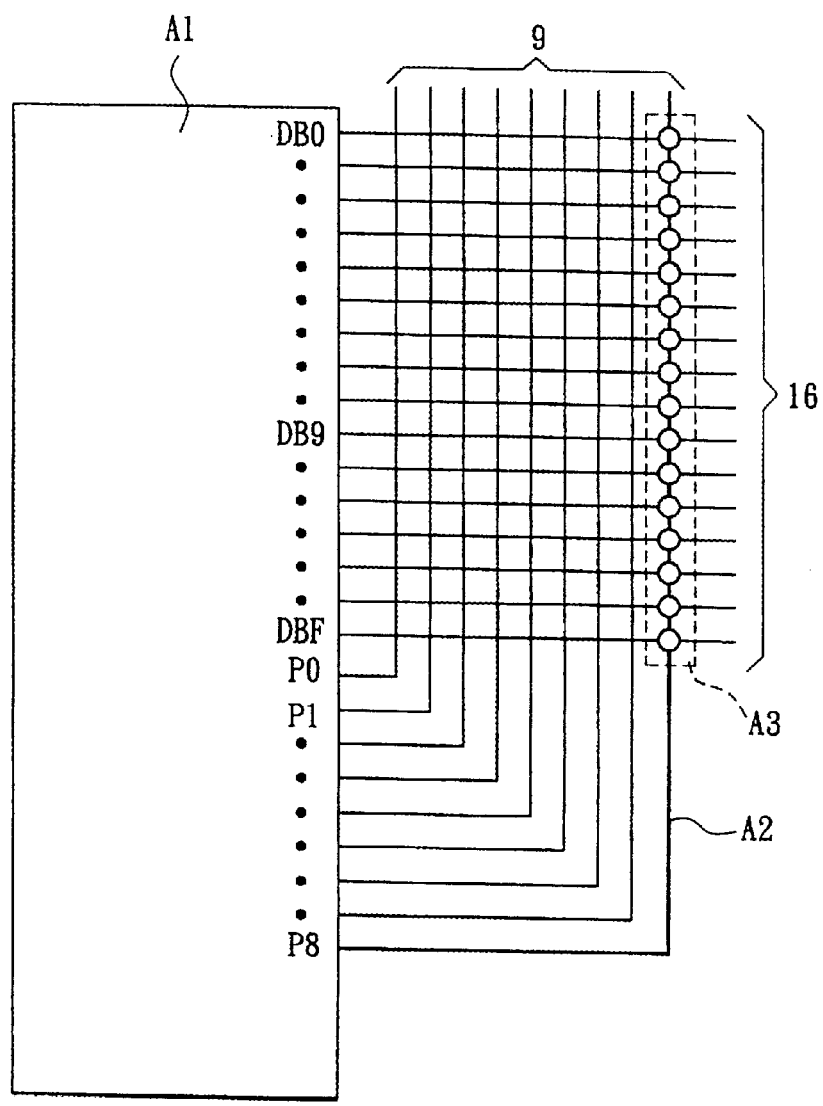
FIG. 1 illustrates the circuit of a prior art keyboard.
Figure 2:
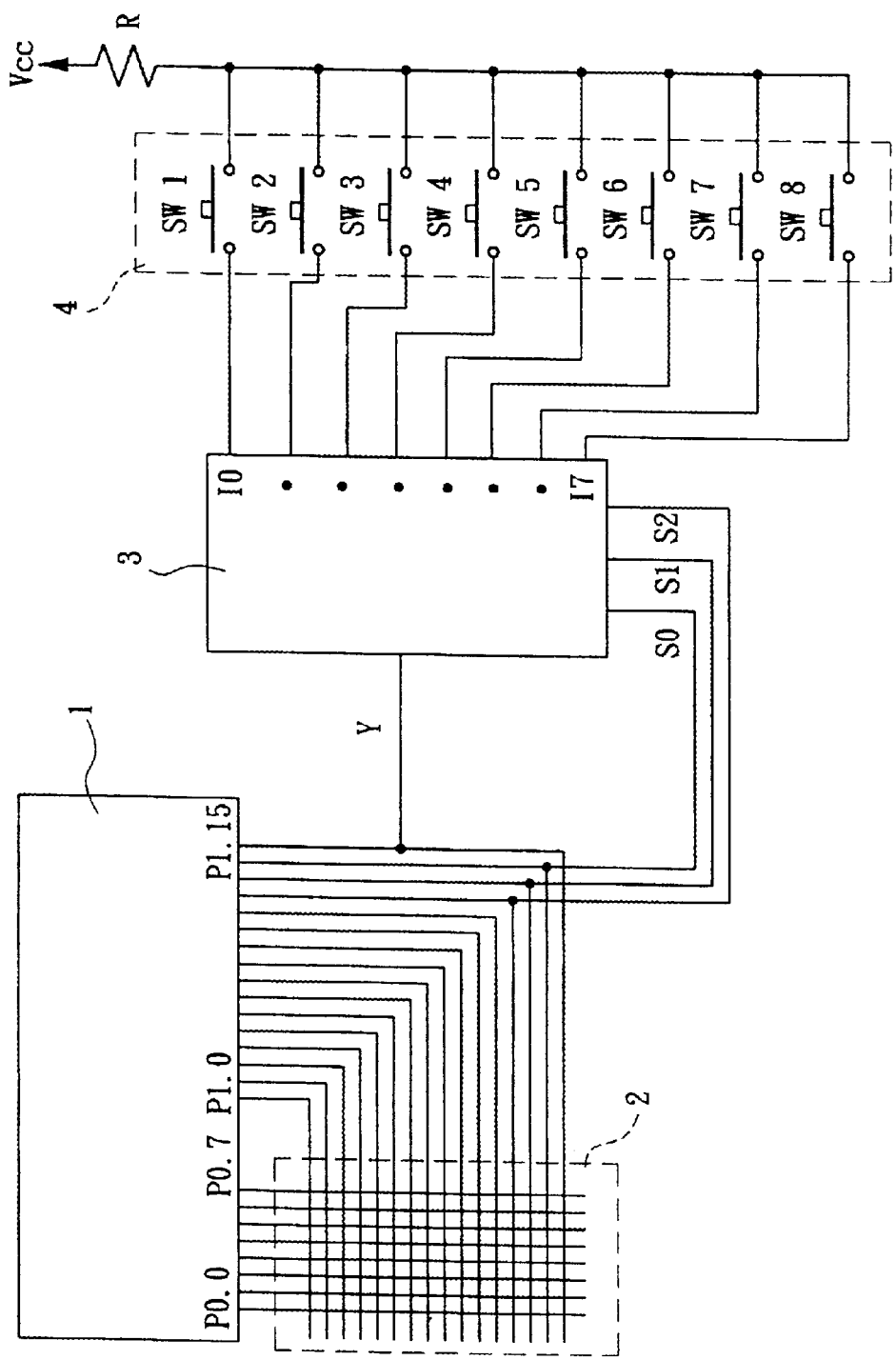
FIG. 2 illustrates certain circuit elements of a keyboard according to the present invention.

FIG. 2 illustrates certain circuit elements for a keyboard according to one preferred embodiment for the present invention. The keyboard in FIG. 2 has a microprocessor 1, a scan matrix 2, a digital logic circuit 3, and a plurality of additional keys 4. The processor 1 can be a standard processor (like a microprocessor) that is used with any conventional keyboard, and the scan matrix 2 can be a conventional 8×16 scan matrix that is connected to the processor 1 in the same manner as in a conventional keyboard. The digital logic circuit 3 can be embodied in the form of a multiplexer, a parallel to serial converter, or any similar circuit. The plurality of additional keys 4 is illustrated as having eight such keys, denoted by eight switches SW1–SW8. Each key SW1–SW8 is coupled to a voltage source Vcc via a resistor R, and is also coupled to a corresponding one of a plurality of inputs 10–17 of the digital logic circuit 3.

The digital logic circuit 3 is described hereinafter in the form of a multiplexer, although as noted above, it can be embodied in the form of other known circuits. The digital logic circuit 3 has an output coupled via an I/O line Y to one of the scan lines (e.g., P1.15) of the scan matrix 2. The digital logic circuit 3 has three inputs coupled via three separate I/O lines S0, S1, S2 from three corresponding scan lines (e.g., P1.12, P1.13, P1.14) of the scan matrix 2. The output Y is provided to the processor 1 to inform the processor 1 whether one of the keys SW1–SW8 has been pressed, and the inputs S0, S1, S2 are provided from the processor 1 to allow the processor 1 to decode the identity of the key SW1–SW8 that has been pressed.

FIG. 3 illustrates the logic control for the keys SW1–SW8 and the logic control circuit 3. If none of the keys SW1–SW8 are pressed, then Y will always be 0. On the other hand, if any one of the keys SW1–SW8 is pressed, then Y will be 1. Each of S0, S1, S2 has a value of 0 or 1. Since the example of FIG. 2 provides three I/O lines S0, S1, S2, there are $2^3=8$ different logic combinations, represented by 000, 001, 010, 011, 100, 101, 110 and 111. Since there are eight logic combinations, this means that there are eight additional function keys.

In the present invention, the processor 1 continually provides the eight different logic combinations 000–111 to the logic control circuit 3. As a non-limiting example, assume that the key SW1 has been pressed. The digital logic circuit 3 will output a value of 1 at its Y output. At this time, the processor 1 will know which switch SW1–SW8 has been pressed because the processor 1 will look for the value of S0, S1, S2 that coincides to the receipt of the value 1 from the output Y. Thus, a logic status for pressing key SW1 is formed by Y, S0, S1, S2, which is 1000. This logic code may be defined (by the user or the manufacturer) as being an instruction for, for example, playing a CD-ROM. Thus, a CD-ROM can be played by merely pressing a single key on a keyboard. In a similar manner, it is possible to control an application program (e.g., signing on to the Internet, receiving electronic mail, among others) or to manipulate a desired function of a peripheral device (e.g., volume control, selecting songs, etc.) by pressing a single key on a keyboard.

In addition, even though FIG. 2 illustrates the provision of eight additional keys, the number of additional keys can be varied as desired. For example, it is possible to provide sixteen additional keys by providing four output lines S0, S1, S2, S3, or to provide thirty-two additional keys by providing five output lines S0, S1, S2, S3, S3, and so on.

Although the digital logic circuit 3 is illustrated in FIG. 2 as being separate from the microprocessor 1, it is also possible for the digital logic circuit 3 to be incorporated inside the processor 1 in a single chip. In such an embodiment, the output Y and inputs S0, S1, S2 will not need to be coupled to the scan lines of the scan matrix 2, but will be internally connected to the appropriate parts of the processor 1.

Thus, the present invention provides a logic circuit 3 that can be coupled to the processor 1 either directly or via an original or conventional scan matrix 2 to increase the number of additional keys on a conventional keyboard. Thus, the size of the scan matrix does not need to be increased, and no additional ports are needed.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A keyboard, comprising:
    a processor;
    a scan matrix coupled to the processor;
    a first set of keys coupled to the scan matrix;
    a logic control circuit having an output coupled to the scan matrix; and
    a second set of keys coupled to the scan matrix via the logic control circuit;
    wherein the processor decodes the identity of a pressed key from the second set of keys and the output of the logic control circuit.

2. The keyboard of claim 1, wherein the output of the logic control circuit indicates whether one of the keys from the second set of keys has been pressed.

3. The keyboard of claim 1, wherein the scan matrix is a conventional 8×16 scan matrix.

4. The keyboard of claim 3, wherein the output of the logic control circuit has n lines, and the second set of keys has a total of $2^n$ keys.

5. The keyboard of claim 1, wherein the logic control circuit is a multiplexer.

6. The keyboard of claim 1, wherein the logic control circuit is a parallel to serial converter.

7. The keyboard of claim 1, further including a plurality of lines coupling the logic control circuit and the scan matrix, wherein the plurality of lines indicates the identity of the pressed key.

8. A method of utilizing one of a plurality of additional keys in a keyboard to execute a function, comprising:
    providing a keyboard having a processor, a scan matrix coupled to the processor, a first set of keys coupled to the scan matrix, a logic control circuit having an output coupled to the scan matrix, and a second set of keys coupled to the scan matrix via the logic control circuit, the second set of keys representing the plurality of additional keys;
    pressing one of the second set of keys;
    providing the identity of the pressed key to the processor via the scan matrix; and
    executing the function.

9. The method of claim 8, further including:
    providing an output from the logic control circuit to the processor to indicate that one of the second set of keys has been pressed.

* * * * *